(12) United States Patent
Hafez et al.

(10) Patent No.: US 11,664,417 B2
(45) Date of Patent: May 30, 2023

(54) III-N METAL-INSULATOR-SEMICONDUCTOR FIELD EFFECT TRANSISTORS WITH MULTIPLE GATE DIELECTRIC MATERIALS

(71) Applicant: Intel Corporation, Santa Clara, CA (US)

(72) Inventors: Walid Hafez, Portland, OR (US); Han Wui Then, Portland, OR (US); Sansaptak Dasgupta, Hillsboro, OR (US); Marko Radosavljevic, Portland, OR (US); Paul Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1036 days.

(21) Appl. No.: 16/130,911

(22) Filed: Sep. 13, 2018

(65) Prior Publication Data

US 2020/0091285 A1    Mar. 19, 2020

(51) Int. Cl.
| | |
|---|---|
| *H01L 29/06* | (2006.01) |
| *H01L 27/088* | (2006.01) |
| *H01L 21/8236* | (2006.01) |
| *H01L 29/51* | (2006.01) |
| *H01L 29/20* | (2006.01) |

(52) U.S. Cl.
CPC ...... *H01L 29/0638* (2013.01); *H01L 21/8236* (2013.01); *H01L 27/0883* (2013.01); *H01L 29/2003* (2013.01); *H01L 29/51* (2013.01)

(58) Field of Classification Search
CPC ............ H01L 29/0638; H01L 21/8236; H01L 27/0883; H01L 29/2003; H01L 29/51; H01L 29/0847; H01L 29/4236; H01L 21/8252; H01L 27/0605; H01L 29/513;
(Continued)

(56) References Cited

U.S. PATENT DOCUMENTS 7,586,159 B2 * 9/2009 Lee .................. H01L 27/0922
                                                              257/411
8,022,486 B2 * 9/2011 Sekine ............ H01L 21/823857
                                                              257/407
(Continued)

*Primary Examiner* — Shouxiang Hu
(74) *Attorney, Agent, or Firm* — Essential Patents Group, LLP

(57) ABSTRACT

Integrated circuits with III-N metal-insulator-semiconductor field effect transistor (MISFET) structures that employ one or more gate dielectric materials that differ across the MISFETs. Gate dielectric materials may be selected to modulate dielectric breakdown strength and/or threshold voltage between transistors. Threshold voltage may be modulated between two MISFET structures that may be substantially the same but for the gate dielectric. Control of the gate dielectric material may render some MISFETs to be operable in depletion mode while other MISFETs are operable in enhancement mode. Gate dielectric materials may be varied by incorporating multiple dielectric materials in some MISFETs of an IC while other MISFETs of the IC may include only a single dielectric material. Combinations of gate dielectric material layers may be selected to provide a menu of low voltage, high voltage, enhancement and depletion mode MISFETs within an IC.

13 Claims, 13 Drawing Sheets

(58) Field of Classification Search
CPC ........... H01L 29/66462; H01L 29/7786; H01L 21/823462
See application file for complete search history.

(56) References Cited

U.S. PATENT DOCUMENTS

2007/0218598 A1* 9/2007 Niimi .............. H01L 21/823462
257/E21.639
2013/0264652 A1* 10/2013 Zhu ................. H01L 21/823842
257/369
2018/0277535 A1* 9/2018 Fareed ................ H01L 27/0605

* cited by examiner

| MISFET \ Gate Ox | Dielectric Layer 1 | Dielectric Layer 2 | Dielectric Layer 3 |
|---|---|---|---|
| E-Mode HV | Yes | Yes | No |
| D-Mode HV | Yes | Yes | Yes |
| E-Mode LV | Yes | No | No |
| D-Mode LV | Yes | No | Yes |

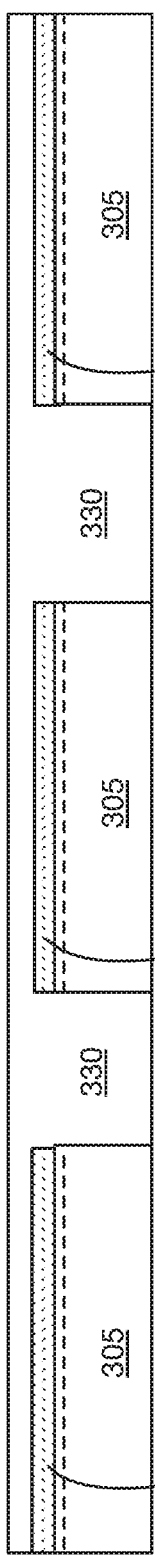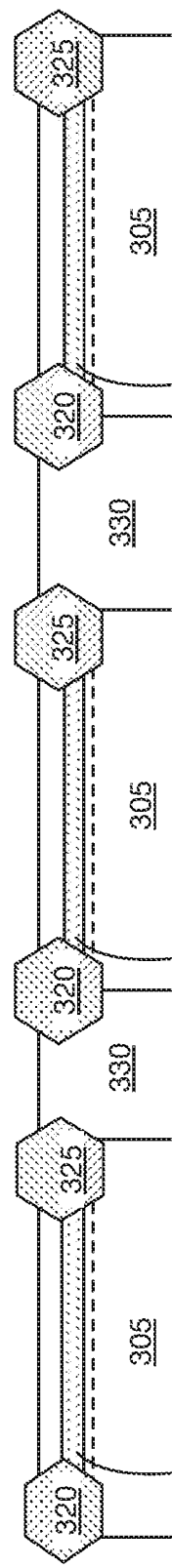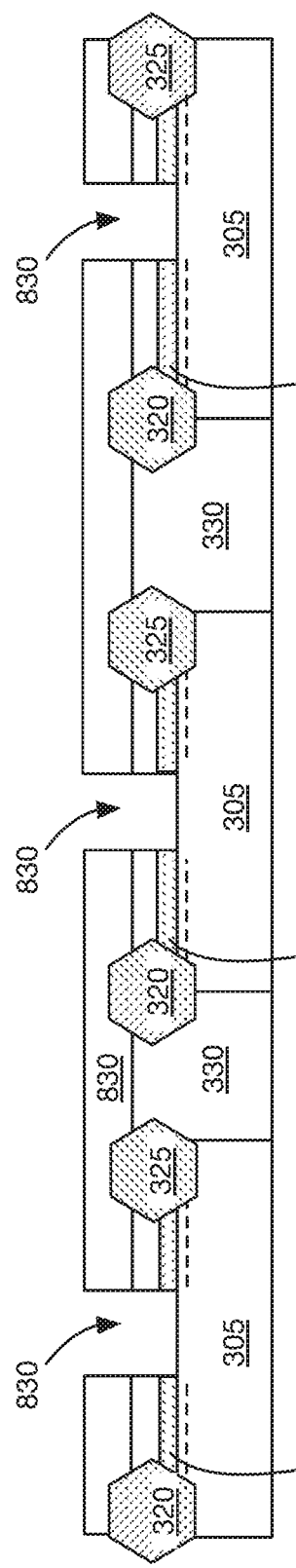

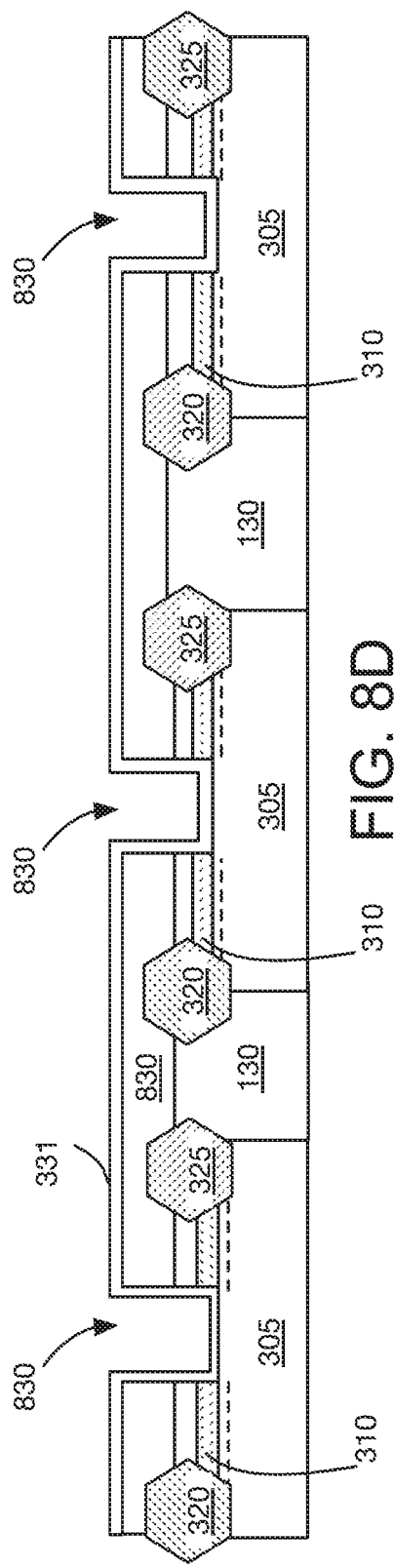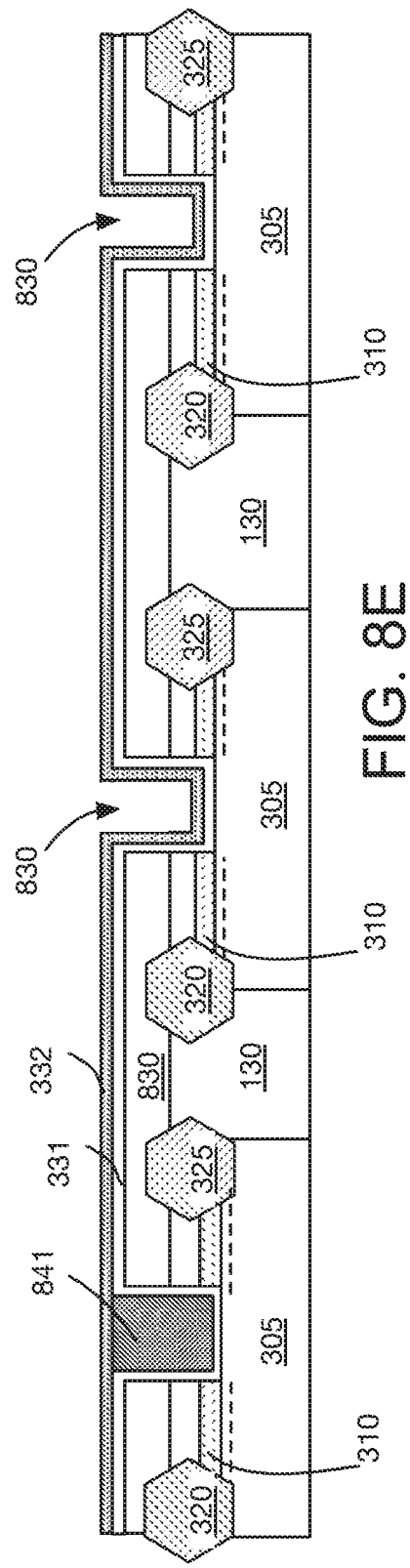

III-N METAL-INSULATOR-SEMICONDUCTOR FIELD EFFECT TRANSISTORS WITH MULTIPLE GATE DIELECTRIC MATERIALS

BACKGROUND

Demand for integrated circuits (ICs) in portable electronic applications has motivated greater levels of semiconductor device integration. Many advanced semiconductor devices in development leverage non-silicon semiconductor materials, some of which offer the potential of high breakdown voltages. The group III-nitride (III-N) material system shows particular promise for high voltage and high frequency applications like power management ICs and RF power amplifiers.

GaN transistors have conventionally employed metal-semiconductor field effect transistor (MESFET) architectures. An example of a MESFET structure 101 is shown in FIG. 1A. MESFET structure 101 includes a first III-N material 105 and second III-N layer 110 over III-N layer 105 to form a two-dimensional carrier gas (2DEG) 112. A gate electrode 115 forms a Schottky junction with III-N material 110. A coupling of source 120 to drain 125 through 2DEG 112 may be modulated by appropriate gate bias ($V_G$), according to the field effect. MESFET structure 101 is a depletion mode device because absent a non-zero gate bias, current may flow between source 120 biased at a source node voltage Vs and drain 125 biased at drain node voltage $V_D$. In MESFET structure 102 shown in FIG. 1B, gate electrode 115 is recessed into III-N material 110 and 2DEG 112 is depleted proximal to gate electrode 115 even under zero gate bias. MESFET structure 102 is therefore an enhancement mode device where under a zero voltage gate bias, current will not flow between source 120 and drain 125. Enhancement mode device structures can be considerably more difficult to fabricate than depletion mode devices as the gate recess process may entail the use of complex epitaxial stacks (e.g., including one or more etch stops, etc.)

Even if both enhancement mode and depletion mode MESFETs are successfully fabricated, they can be expected to suffer from high forward bias gate leakage that limits the operational range to gate voltages that are below the turn-on voltage of the diodic gate Schottky junction, which is a limitation on MESFET performance (typically manifested in low output power and power efficiency).

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 8A-8H are cross-sectional views of III-N MISFET structures as selected operations of the methods illustrated in FIG. 7 are performed, in accordance with some embodiments;

DETAILED DESCRIPTION

Figure 1A:
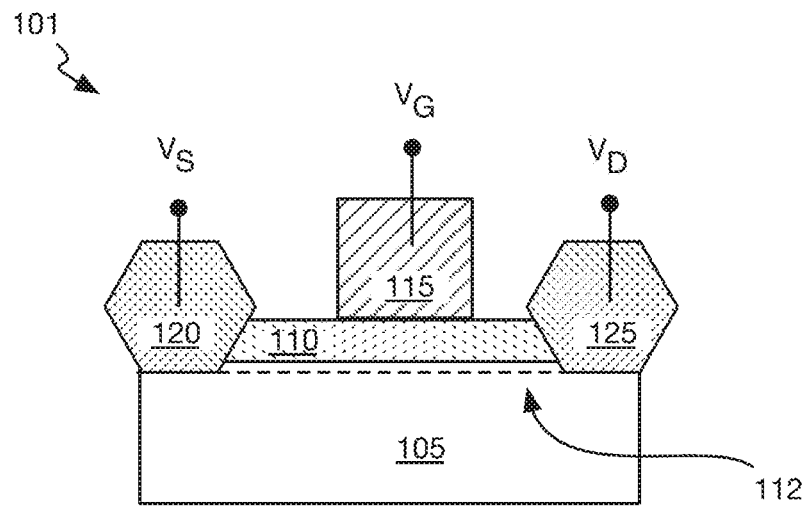
FIG. 1A and 1B illustrate conventional III-N MESFET structures.
Figure 1B:
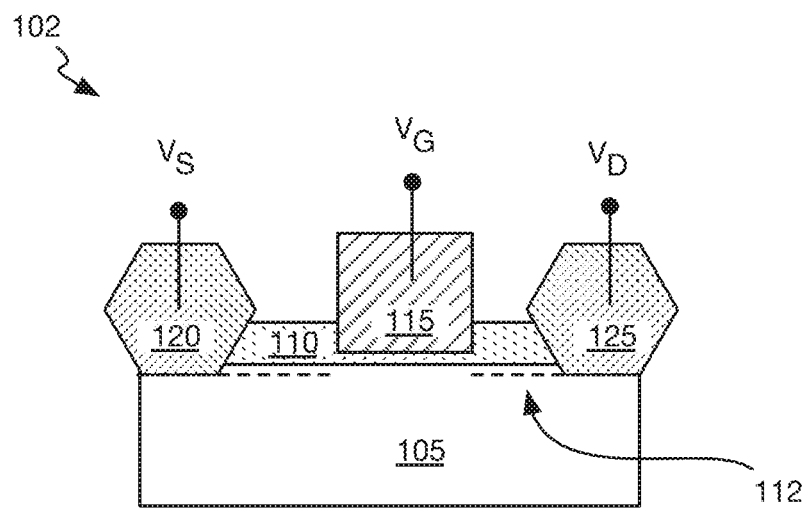

III-N transistor structures suitable for high voltage and low voltage operation, and suitable for depletion mode and enhancement mode operation, are described herein. Exemplary methods of fabricating an IC including such devices are also described. In the following text, numerous specific details are set forth, such as illustrative device architectures, to provide a thorough understanding of embodiments of the present disclosure. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

Certain terminology may also be used in the following description for the purpose of reference only, and thus are not intended to be limiting. For example, terms such as "top," "bottom," "upper", "lower", "over," "above", "under," and "below" refer to directions in the drawings to which reference is made. Terms such as "front", "back", "rear", and "side" describe the orientation and/or location of portions of the component within a consistent but arbitrary frame of reference, which is made clear by reference to the text and the associated drawings describing the component under discussion. Such terminology may include the words specifically mentioned above, derivatives thereof, and words of similar import. The terms "over," "under," "between," and "on" may also be used herein to refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In embodiments described further herein, integrated circuits with III-N metal-insulator-semiconductor field effect transistor (MISFET) structures employ one or more gate dielectric materials that differ across the MISFET structures. As described further below, different gate dielectric materials may be selected to modulate gate dielectric breakdown strength, and/or threshold voltage ($V_t$) between transistors of an IC. In some embodiments, threshold voltage is modulated between two MISFETs structures that are substantially the same but for the gate dielectric. A gate dielectric may be controlled so that some MISFETs of an IC device are operable in depletion mode while other MISFETs of the IC device are operable in enhancement mode. Gate dielectric materials may be varied across an IC by incorporating multiple dielectric materials in some MISFETs while other MISFETs of the IC may include only a single dielectric material. Combinations of gate dielectric material layers may be selected to provide a menu of low voltage, high voltage, enhancement mode, and/or depletion mode MISFETs within an IC. In some embodiments, one, two, three, or more dielectric material layers may be employed within a MISFET to achieve desired transistor parametrics.

Figure 2:
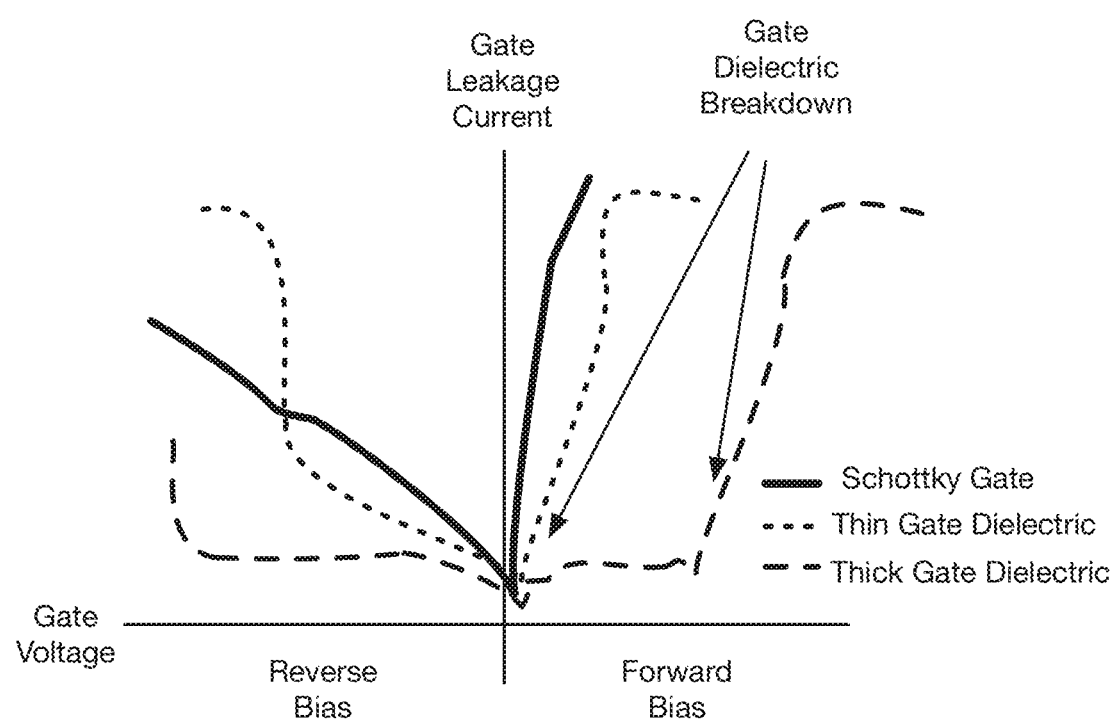
FIG. 2 is an I-V graph comparing gate leakage current of a III-N MESFET structure under forward and reverse bias compared with that of III-N MISFET structures in accordance with some embodiments.

FIG. 2 is an I-V graph comparing gate leakage current of a III-N MESFET structure under forward and reverse bias (gate-to-source, VGs) compared with that of III-N MISFET structures in accordance with some embodiments. As shown in solid line, a MESFET structure suffers high gate leakage current at low forward bias voltages where the metal-semiconductor junction has turned "on." A MISFET structure including a first gate dielectric between a gate electrode and III-N semiconductor is further shown in small dashed line. The addition of gate dielectric avoids the diodic behavior of the MESFET with gate leakage current dramatically increasing only upon breakdown of the gate dielectric. A MISFET structure including a second, different, gate dielectric between a gate electrode and III-N semiconductor is further shown in large dashed line. The different gate dielectric increases the dielectric breakdown voltage, thereby increasing the suitable operating voltage range of the device. In accordance with some embodiments, the gate dielectric is different across multiple III-N MISFET structures such that some may be tailored to operate at high(er) voltages while others are tailored to operate at low(er) voltages.

In accordance with some embodiments herein, a gate dielectric may be modulated, or made different, by varying an equivalent oxide thickness (EOT) of the gate dielectric. To vary the EOT, thickness of a given gate dielectric material may be varied across multiple III-N MISFET structures, and/or different gate dielectric material compositions may be employed across multiple III-N MISFET structures. Gate dielectric material compositions may be made different by supplementing a first gate dielectric material employed within a first III-N MISFET with a second dielectric material such that a second III-N MISFET may then include both the first and second dielectric materials within a gate dielectric stack. Notably, layered gate dielectric stacks are not limited to two material layers, and may instead comprise any number of material layers (e.g., three, or more). Alternatively, gate dielectric materials may be differentiated through the use of a first gate dielectric material within a first III-N MISFET and the use of a second, different, dielectric material within a second III-N MISFET. In other embodiments, a first III-N MISFET may use any combination of gate material layers in a first gate dielectric stack while a second III-N MISFET may use any other (different) combination of gate material layers in a second gate dielectric stack. For any of these embodiments, gate dielectric material(s) employed in a first III-N MISFET structure may have different thickness(es) from gate dielectric materials employed in a second III-N MISFET. For example, thicknesses of one or more of the gate dielectric materials employed as a first MISFET gate dielectric (layer or stack) may be different than the thicknesses of one or more of the gate dielectric materials employed in as a second MISFET gate dielectric (layer or stack).

In addition to impacting gate breakdown voltages, the inventors have found that the gate dielectric can also impact the threshold voltage of a III-N MISFET. Where a single threshold voltage for all III-N MISFET of an IC may be sufficient in some applications, MISFETs having two or more different threshold voltages within a single IC may be advantageous as provisioning multiple threshold voltages enable circuit designers to select from a menu of available devices as the best option for each MISFET employed within a circuit design, for example based on a trade-off between power and performance. Depending on the gate dielectric material employed, the inventors have observed anywhere from 100 mV to a 5V swing in MISFET threshold voltage, spanning 0V. Notably, this $V_t$ swing is attributable to the gate dielectric independent of the gate electrode composition or III-N semiconductor composition (e.g., doping or alloy). Hence, while the gate electrode metal-to-semiconductor workfunction difference may also have an impact on $V_t$, the threshold voltage of a III-N MISFET may be tuned through modulation of the gate dielectric even where the gate electrode material remains fixed. Although not bound by theory, it is currently thought that both composition of a gate dielectric material and thickness of the gate dielectric material impact threshold voltage of a III-N MISFET. For example, a gate dielectric material composition that introduces more fixed charge can shift the threshold voltage of a III-N MISFET relative to that of a device that has a gate dielectric material associated with lower fixed charge (but is otherwise substantially the same).

Figure 3A:
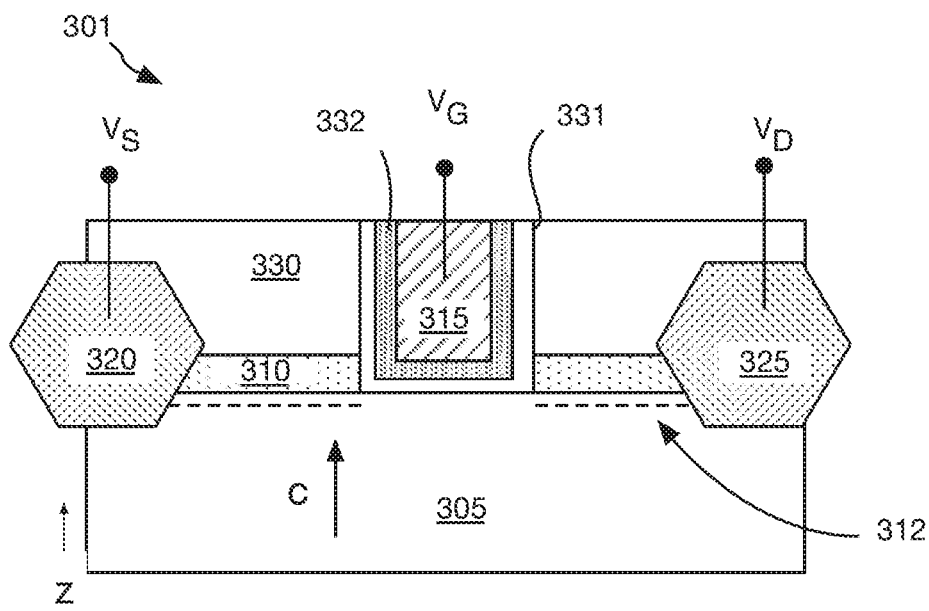
FIG. 3A is a cross-sectional profile view of a III-N MISFET structure with a first gate dielectric, in accordance with some embodiments.

Gate dielectric modulation may be employed to select between depletion and enhancement modes of operation for III-N MISFET structures. In some embodiments, an enhancement mode III-N MISFET structure has a first gate dielectric, and a depletion mode III-N MISFET has a second gate dielectric. In some embodiments, both depletion and enhancement mode III-N MISFETS share substantially all of their architecture but for their gate dielectrics. FIG. 3A is a cross-sectional profile view of III-N MISFET structure 301 with a first gate dielectric, in accordance with some embodiments. MISFET structure 301 is an enhancement mode device that is in an "off" state at zero voltage (gate-to-source). For the exemplary N-type III-N enhancement mode MISFET structure 301, an "on" state is achieved when the gate voltage $V_G$ is sufficiently biased (e.g., +1V) relative to the source voltage $V_S$.

III-N MISFET structure 301 may be over any suitable substrate (not depicted). In some embodiments, the substrate is crystalline SiC. In other embodiments, the substrate is a cubic semiconductor, such as monocrystalline silicon. For such embodiments, III-N MISFET structure 301 may be formed over a cubic substrate surface, such as a (100) surface. III-N crystals may also be grown on other surfaces (e.g., 110, 111, miscut or offcut, for example 2-10° toward [110] etc.). III-N transistor structure 301 may also be over a host substrate material upon which the III-N crystal has been bonded. For such embodiments, the host substrate may be crystalline, or not (e.g., glass, polymer, etc.).

III-N MISFET structure 301 includes a first III-N material 305 and a second III-N material 310. III-N materials 305 and 310 may each have substantially monocrystalline microstructure (e.g., hexagonal Wurtzite). Although monocrystalline, it is noted that crystal quality of III-N crystalline materials may vary dramatically, for example as a function of the techniques employed to form material layers 305 and 310, and the growth substrate employed. In some exemplary embodiments, dislocation density with III-N material layer 305 is in the range of $10^6$-$10^{11}$/cm$^2$. FIG. 3A illustrates crystal orientations of III-N materials 305 and 310, in accordance with some embodiments where the thickness of the materials along a c-axis of the crystal is approximately on the z-axis, substantially orthogonal to a plane of an underlying substrate. In this orientation, the crystal structure of III-N materials 305 and 310 lack inversion symmetry with the (0001) and (000-1) planes not being equivalent. In illustrated embodiments, III-N material layers 305 and 310 may be characterized as having +c polarity with the c-axis extending in the <0001> direction.

III-N material 305 comprises nitrogen as a first majority lattice constituent, and has a second majority lattice constituent including one or more elements from Group III of the Periodic table. III-N material 305 may be any III-N material known to be suitable as a transistor channel material. In some embodiments, III-N material 305 is a binary alloy (e.g., GaN, AlN, InN). In some such embodiments, which have an advantageously high carrier mobility, III-N material 305 is binary GaN. In some other embodiments, III-N material 305 is a ternary alloy (e.g., $Al_xIn_{1-x}N$, $In_xGa_{1-x}N$, or $Al_xGa_{1-x}N$). In still other embodiments, III-N material 305 is a quaternary alloy (e.g., $In_xGa_yAl_{1-x-y}N$). III-N material 305 may have any impurity dopants. However, in some advantageous embodiments, III-N material 305 is intrinsic and not intentionally doped with impurities associated with a particular conductivity type. For example, intrinsic impurity (e.g., Si) level in III-N material 305 may be advantageously less than 1e17 atoms/cm$^3$, and in some embodiments is between 1e14 and 1e16 atoms/cm$^3$.

III-N material 310 comprises nitrogen as a first majority lattice constituent, and has a second majority lattice constituent including one or more elements from Group III of the Periodic table. III-N material 310 may be any III-N material known to be suitable as a polarization material for III-N material 305. III-N material 310 may comprise any alloy distinct from that of III-N material 305 so as to modulate the polarization field strength (e.g., spontaneous and/or piezoelectric) between these two III-N materials. Where spontaneous and/or piezoelectric polarization field strengths are sufficiently different between III-N material 305 and III-N material 310, a two-dimensional charge carrier sheet (e.g., 2D electron gas or "2DEG" 312) is formed within III-N material 305 in the absence of any externally applied field. The 2DEG in III-N material 305 may be located within a few nanometers of the heterojunction with III-N material 310. III-N material 310 may therefore be referred to as a "polarization layer" because it induces a polarization charge into the heterostructure. In some embodiments, III-N material 310 comprises a binary alloy (e.g., GaN, AlN, InN). In some other embodiments, III-N material 310 comprises a ternary alloy (e.g., $Al_xIn_{1-x}N$, $In_xGa_{1-x}N$, or $Al_xGa_{1-x}N$). In still other embodiments, III-N material 310 comprises a quaternary alloy (e.g., $In_xGa_yAl_{1-x-y}N$). In some embodiments, III-N material 310 has a greater amount of Al and/or In than does III-N material 305. In some such embodiments, III-N material 310 includes a layer of binary AlN. In further embodiments, III-N material 310 comprises multiple material layers, each of which may have a distinct III-N alloy composition.

MISFET structure 301 further includes a source 320 and a drain 325. Between source and drain 320, 325 is a gate stack that includes a gate electrode 315 along with a gate dielectric stack that comprises both a first gate dielectric material 331, and a second gate dielectric material 332. During operation, source 320 may be biased as a first circuit node at a source voltage $V_S$, while drain 320 may be biased as a second circuit node at a drain voltage $V_D$. Gate electrode 315 may be biased during transistor operation as a third circuit node at a gate voltage $V_G$ suitable for controlling conduction through a channel portion of MISFET structure 301.

The source and drain 320, 325 may each extend through III-N material 310, land on, or embed within, III-N material 305. In the illustrated example, source and drain 320, 325 are each in physical contact with a c-plane (e.g., Ga-face) of III-N. Source and drain 320, 325 each have access to 2D charge carrier sheet within some nanometers of the heterojunction between and III-N materials 305 and 310. The junction between III-N material 305 and source and drain 320, 325 may be a homojunction or a heterojunction. In some embodiments, source and drain 320, 325 are both also III-N material(s). For example, source and drain 320, 325 may both be InGaN. Some advantageous InGaN embodiments include 5-20% In ($In_xGa_{1-x}N$ with 5%≤x≤20%). The alloy composition of source and drain 320, 325 may be constant or graded between III-N material 305 and a contact metal (not depicted). For some embodiments, source and drain 320, 325 are epitaxial, having the same crystallinity and orientation as III-N material 305. Exemplary hexagonal crystal facets are illustrated in FIG. 3A. For some other embodiments, source and drain 320, 325 are polycrystalline, in which case crystal facets may not be as readily apparent.

Source and drain 320, 325 may each be impurity doped to a desired conductivity type (e.g., doped with Si for n-type conductivity). The doping level of both the source and drain 320, 325 is advantageously as high as practical for lowest transistor terminal/access resistance. The doping level of source and drain 320, 325 may be at least an order of magnitude higher than that of III-N material 305, for example. In some exemplary embodiments where the source 320 and/or drain 325 is a III-N alloy, the impurity dopant level is over 1e19 atoms/$cm^3$, and more advantageously over 1e20 atoms/$cm^3$. Si is one exemplary dopant atom for which such high (N+) doping levels may be achieved in III-N alloys. An alternative N-type dopant is Ge.

Gate electrode 315 is located within a recess in the underlying III-N material that extends a depth (e.g., z-dimension) through at least a partial thickness of III-N material 310. While gate electrode 315 may be recessed completely through III-N material 310, in some advantageous embodiments III-N material 310 has a non-zero c-axis thickness below gate dielectric material 331. The recess depth into III-N material 310 may be predetermined, for example to tune threshold voltage ($V_t$) of the transistor. With gate electrode 315 recessed, 2DEG 312 may be depleted immediately below the gate stack at zero volts $V_G$, as illustrated. Enhancement mode modulation of the 2D charge carrier sheet may thereby control electrical coupling between source 320 and drain 325. The composition of gate electrode 315 may be any known to be suitable for the purpose. In some embodiments, where III-N material 305 is binary GaN, an exemplary gate electrode may include at least one of Ni, W, Pt, or TiN. Each of these metals or metallic compounds may be associated with a particular work function (or metal-semiconductor work function difference) that may have some impact on transistor threshold voltage.

As further illustrated in FIG. 3A, one or more dielectric materials 330 may provide electrical isolation between MISFET structure 301 and other devices of an IC, and/or provide surface passivation of III-N materials 305 and/or 310 not covered by the gate stack or the source and drain. For example, dielectric material(s) 330 may have any composition known in the art to reduce dangling bonds and/or other surface defect states in III-N materials that may result in high transistor leakage currents. In some examples, dielectric material(s) 330 includes silicon and oxygen (e.g., silicon oxides or silicon oxynitrides). In some examples, dielectric material(s) 330 includes silicon and nitrogen (e.g., silicon oxynitrides or silicon nitride). In other embodiments, dielectric material(s) 330 includes a metal and oxygen (e.g., aluminum oxide, hafnium oxide, or titanium oxide). In still other examples, dielectric material(s) 330 comprise another III-N material, such as AlN, or another alloy for example having a wider bandgap than that of III-N material 310. Dielectric material(s) 330 may therefore have any microstructure (e.g., amorphous, polycrystalline or monocrystalline). Although not illustrated, dielectric material(s) 330 may comprise separate material layers and/or structural features (e.g., sidewall spacers), for example as further described elsewhere herein.

In some embodiments, a MISFET gate dielectric is a liner within a recess into a III-N material, and may further be a liner within a recess that also extends through one or more dielectric materials that are over the III-N material. In the example shown in FIG. 3A, the gate dielectric includes a first liner of gate dielectric material 331, and a second liner of gate dielectric material 332 within the gate recess that extends through at least a portion of III-N material 310. Gate dielectric material 331 and gate dielectric material 332 are two different materials and each material may be any suitable for the purpose, such as, but not limited to, silicon dioxide, silicon nitride, silicon oxynitride, and materials having a higher relative permittivity than silicon nitride (i.e., "high-k" dielectrics). Some examples of high-k dielectrics include metal oxides (i.e., comprising a metal and oxygen), such as, but not limited to aluminum oxides, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, tantalum oxide, tantalum silicon oxide, lead scandium tantalum oxide, and lead zinc niobate. Gate dielectric material 331 and gate dielectric material 332 may each have any suitable thickness. In some embodiments, gate dielectric material 331 and gate dielectric material 332 each has a thickness in the range of 3-50 nm.

In some embodiments, gate dielectric material 331 is a dielectric material that provides a good interface with III-N material 310 and/or III-N material 305. In some exemplary embodiments, gate dielectric material 331 is a metal oxide (i.e., comprises at least one metal and oxygen). In some such embodiments, gate dielectric material 331 comprises both aluminum and oxygen (e.g., $Al_2O_3$), or comprises both hafnium and oxygen (e.g. $HfO_x$). In some further embodiments, gate dielectric material 332 is a dielectric material that improves breakdown resistance beyond what gate dielectric 331 could provide at a comparable thickness, or is a dielectric material that introduces more fixed charge than what gate dielectric 331. In some exemplary embodiments where gate dielectric material 331 is a metal oxide, gate dielectric material 332 is another metal oxide different than that of gate dielectric material 331. In some other exemplary embodiments where gate dielectric material 331 is a metal oxide, gate dielectric material 332 comprises at least one of silicon and nitrogen. In some such embodiments, gate dielectric material 332 comprises both silicon and oxygen (e.g., $SiO_2$). In some other embodiments, gate dielectric material 332 comprises both silicon and nitrogen (e.g., $Si_3N_4$). In some exemplary embodiments where gate dielectric material 331 is a metal oxide, gate dielectric material 332 comprises silicon and at least one of oxygen or nitrogen.

Figure 3B:
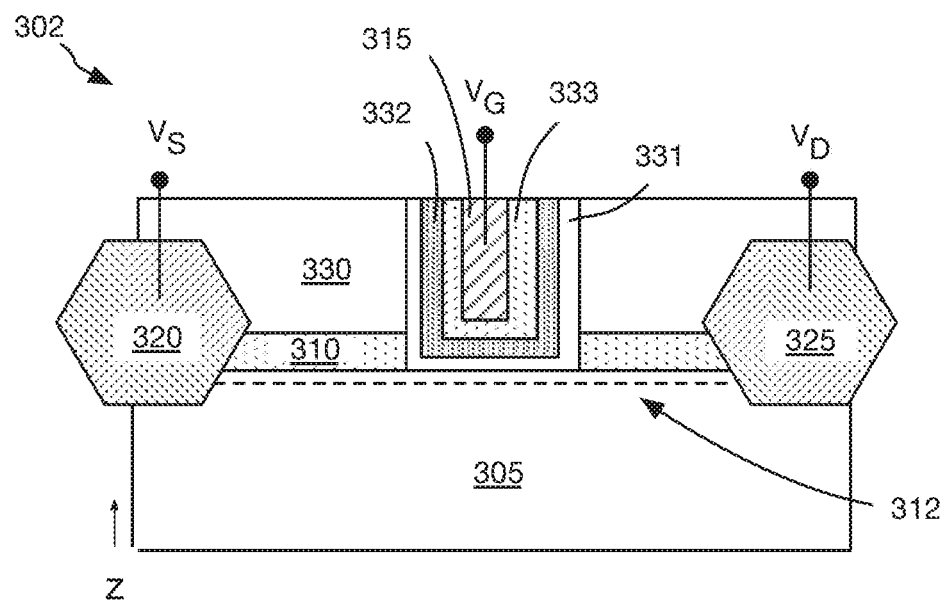
FIG. 3B is a cross-sectional profile view of a III-N MISFET structure with a second gate dielectric, in accordance with some embodiments.

FIG. 3B is a cross-sectional profile view of III-N MISFET structure 302 with a second gate dielectric, in accordance with some embodiments. MISFET structure 302 is a depletion mode device that is in an "on" state at zero gate bias voltage (gate-source). For the exemplary N-type III-N depletion mode MISFET structure 302, an "off" state may be achieved when the gate voltage $V_G$ is pulled negative relative to the source voltage $V_S$. In MISFET structure 302, reference numbers are carried over from MISFET structure 301 wherever the structural features are the equivalent. As shown in FIG. 3B, MISFET structure 302 is substantially identical to MISFET structure 301 with the exception of the gate dielectric being a stack that further includes a gate dielectric material 333 in addition to gate dielectric materials 331 and 332.

In exemplary embodiments where all material compositions, thicknesses and other properties of MISFET structure 302 are the same as those in MISFET structure 301, it is the addition of gate dielectric material 333 that renders MISFET structure 302 a depletion mode device. Gate dielectric material 333 may have a composition different than either or both of gate dielectric materials 331 and 332. In some embodiments, gate dielectric material is a material introducing significant fixed charge into the gate dielectric. In some embodiments, where at least one of gate dielectric materials 331 and 332 comprise a metal oxide, gate dielectric material 333 is other than a metal oxide. In some specific examples, gate dielectric material 333 includes both silicon and nitrogen (e.g., $Si_3N_4$). In some such embodiments where gate dielectric material 331 is a metal oxide, and gate dielectric material 332 comprises at least silicon(e.g., $SiO_2$), gate dielectric material 333 comprises both silicon and nitrogen (e.g., $Si_3N_4$).

Figure 3C:
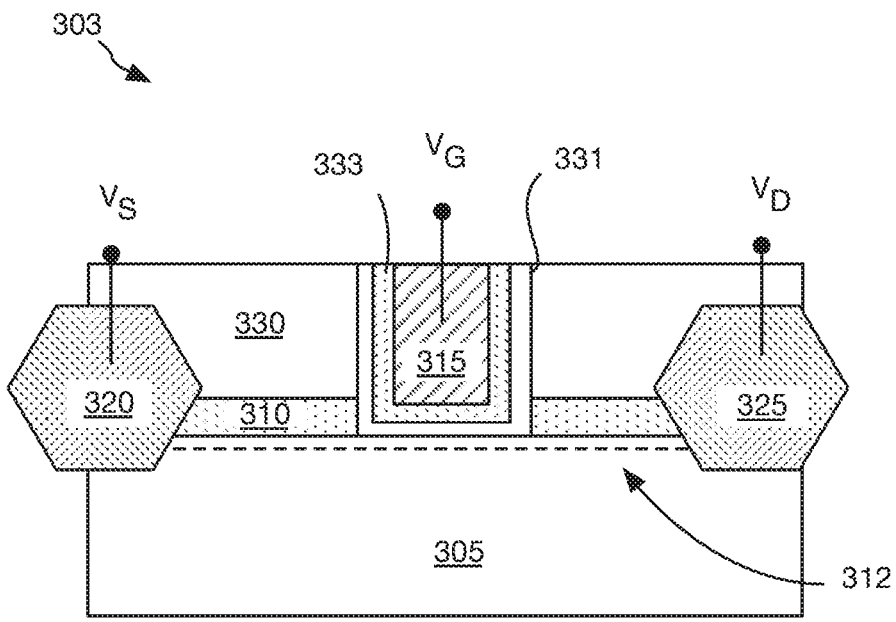
FIG. 3C is a cross-sectional profile view of a III-N MISFET structure with a third gate dielectric, in accordance with some embodiments.

FIG. 3C is a cross-sectional profile view of III-N MISFET structure 303 with a third gate dielectric, in accordance with some embodiments. MISFET structure 303 is again a depletion mode device. MISFET structure 303 is substantially identical to MISFET structure 302 with the exception of the gate dielectric being a stack that includes only gate dielectric material 333 and gate dielectric material 331. In exemplary embodiments where all material compositions, thicknesses, and other properties of MISFET structure 303 are the same as those in MISFET structure 302, the presence of gate dielectric material 333 renders the device operative in depletion mode. With the lack of gate dielectric material 332, MISFET structure 303 may be suitable as a lower voltage depletion mode device having a threshold voltage that may differ from that of MISFET structure 302.

Figure 3D:
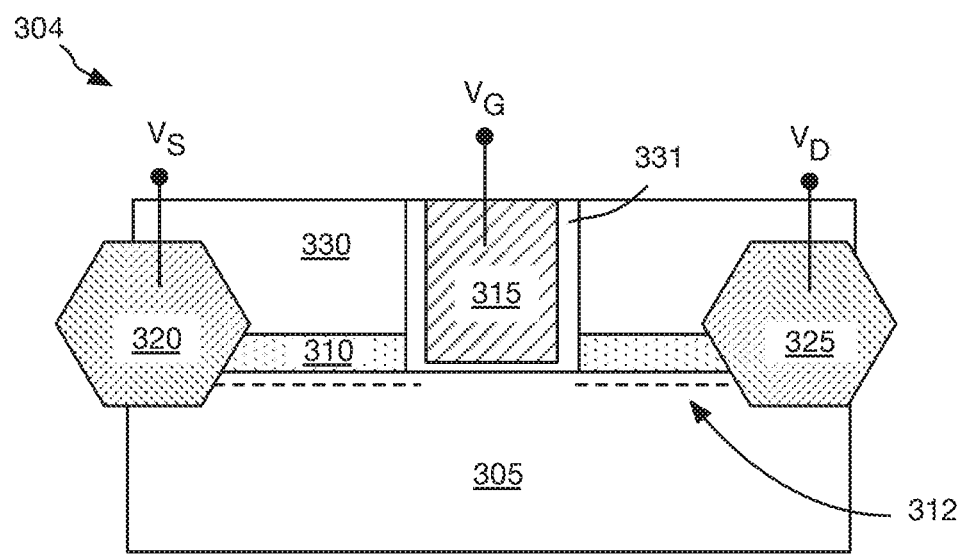
FIG. 3D is a cross-sectional profile view of a III-N MISFET structure with a fourth gate dielectric, in accordance with some embodiments.

FIG. 3D is a cross-sectional profile view of III-N MISFET structure 304 with a fourth gate dielectric, in accordance with some embodiments. MISFET structure 304 is also an enhancement mode device. MISFET structure 304 is substantially identical to MISFET structure 301 except that the gate dielectric includes only gate dielectric material 331. In exemplary embodiments where all material compositions, thicknesses, and other properties of MISFET structure 304 are the same as those in MISFET structure 301, the absence of gate dielectric material 332 may render MISFET structure 304 more suitable as a lower voltage enhancement mode device having a threshold voltage that may differ from that of MISFET structure 301.

Figures 4, 5:
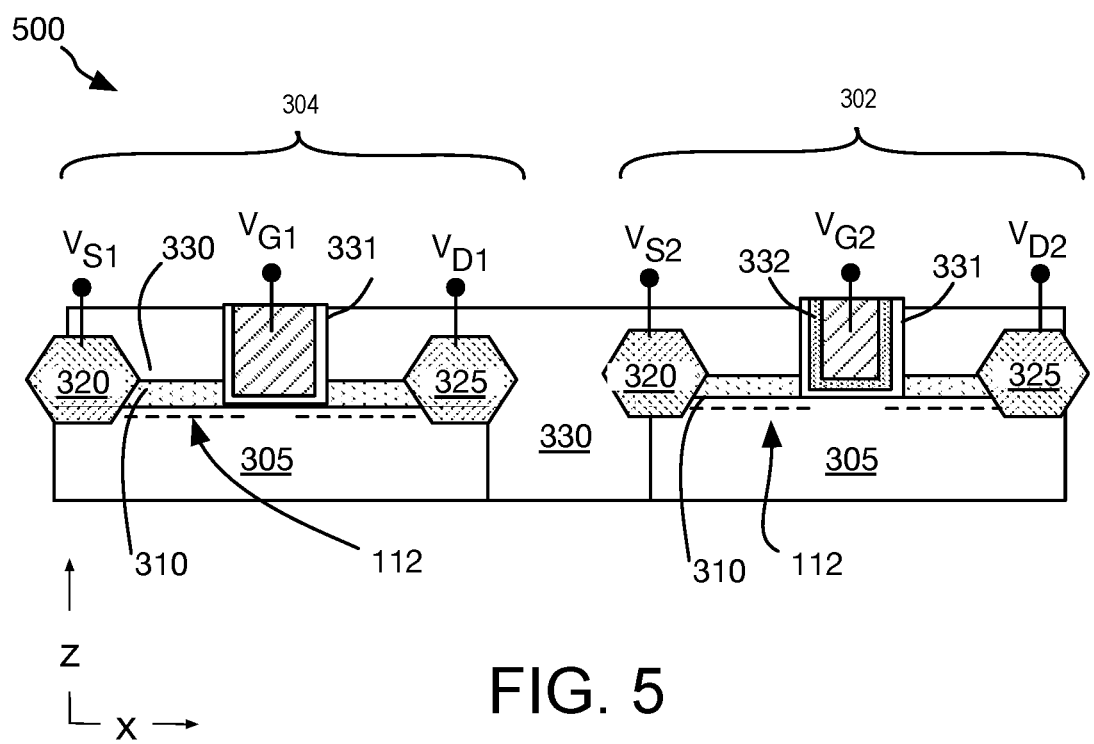
FIG. 4 is a table illustrating different gate dielectrics for a menu of III-N MISFET structures that may be integrated into a single IC device, in accordance with some embodiments.
FIG. 5 is a cross-sectional profile view of an integrated circuit including a plurality of III-N MISFET structures employing different dielectric materials, in accordance with some embodiments.

Hence, as shown in FIG. 3A-3D different gate dielectrics may be implemented in a III-N MISFET to modulate gate dielectric breakdown, threshold voltage, and/or operative mode (depletion/enhancement). Such devices may be employed in different ICs, or incorporated into a single IC. FIG. 4 is a table further illustrating different gate dielectrics for a menu of III-N MISFET structures that may be integrated into a single IC device, in accordance with some embodiments. As shown, an IC may include high and low voltage varieties of either, or both, enhancement (E-mode) or depletion (D-mode) MISFETs and the gate dielectric of such devices may differ. In some advantageous embodiments, the only significant difference between such MISFET "types" is that the gate dielectric differs between them. In that situation, the complexity of concurrently fabricating the variety of devices may be limited to the task of differentiating their gate dielectrics, as described further below.

As shown in FIG. 4, all four MISFET varieties include a first gate dielectric material layer at the interface of the underlying III-N material. The first gate dielectric material layer may be gate dielectric material 331, as described above, for example. As further shown in FIG. 4, the two high voltage MISFET varieties further include a second gate dielectric material layer over the first gate dielectric material layer. The second gate dielectric material layer may be gate dielectric material 332, as described above, for example. As further shown in FIG. 4, the two depletion mode MISFET varieties further include a third gate dielectric material layer over the second gate dielectric material layer. As such, the high voltage MISFET type includes three gate dielectric material layers while the low voltage MISFET type includes only two (the first and third gate dielectric material layers). The third gate dielectric material layer may be gate dielectric material 333, as described above, for example.

FIG. 5 is a cross-sectional profile view of an integrated circuit 500 including a plurality of III-N MISFET structures employing different dielectric materials, in accordance with some embodiments. As shown, IC 500 includes both MISFET structure 302 and MISFET structure 304, each having all the features as described above. IC 500 is therefore an example of two enhancement mode devices, one having a higher voltage rating (MISFET structure 302) than the other, and the two potentially also having different threshold (and subthreshold) I-V characteristics. In the exemplary embodiment illustrated, the composition of gate electrode 315 is the same for each of the MISFET structure 302 and 304. The compositions of III-N materials 305 and 310 may likewise be the same, as may the compositions of the sources 320 and drains 325. MISFET structure 302 and 304 may also have substantially the same amount of gate recess into III-N material 310. As such, the architectural differences between MISFET structures 302 and 304 may be limited exclusively to the gate dielectric.

Figure 6:
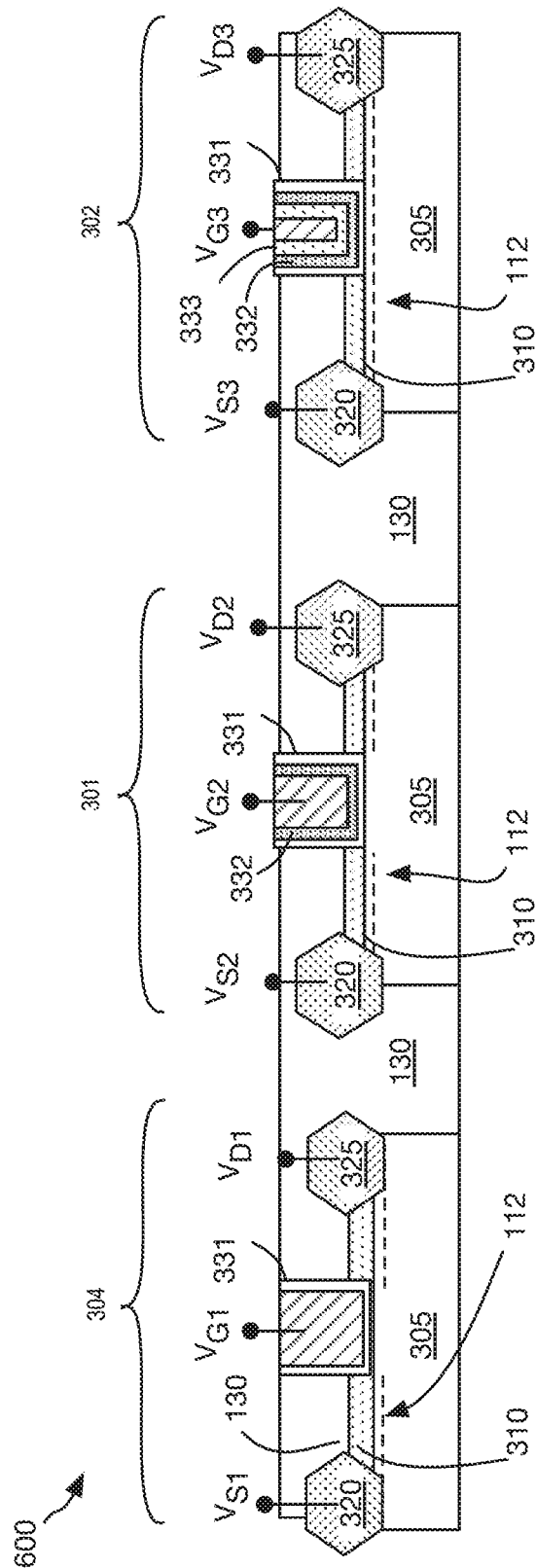
FIG. 6 is a cross-sectional profile view of an integrated circuit including a plurality of III-N MISFET structures employing different dielectric materials, in accordance with some embodiments.

FIG. 6 is a cross-sectional profile view of an integrated circuit 600 including a plurality of III-N MISFET structures employing different dielectric materials, in accordance with some embodiments. IC 600 may be fabricated on a single substrate (not depicted), such as any of those described above. IC 600 includes MISFET structures 301, 302 and 304, each having the features as described above. IC 600 is therefore an example of two depletion mode devices (MISFET structures 301 and 304), one having a higher voltage rating (MISFET structure 301) than the other, and the two MISFET structure potentially also having different threshold (and subthreshold) voltage characteristics. IC 600 further includes an enhancement mode device (MISFET structure 302), which may be further suitable for high voltage operation since the gate dielectric comprises the three gate dielectric materials 331, 332, and 333. In the exemplary embodiment illustrated, the composition of gate electrode 315 is the same for each of the MISFET structures 301, 302 and 304. The compositions of III-N materials 305 and 310 may likewise be the same, as may the compositions of the sources 320 and drains 325. MISFET structures 301, 302 and 304 may also all have substantially the same amount of gate recess into III-N material 310. As such, the architectural differences between MISFET structures 301, 302 and 304 may be limited to exclusively the gate dielectric. Specifically, each of MISFET structures 304, 301, and 302, have one additional gate dielectric material layer, respectively.

IC 600 may further include a fourth MISFET (not depicted) having a gate dielectric comprising only gate dielectric materials 331 and 333(e.g., MISFET structure 303 of FIG. 3C). Although in the exemplary embodiments, all MISFET structures of an IC include at least the same interface gate dielectric material (e.g., gate dielectric material 331), different gate dielectric materials might also be employed as an interface material contacting an underlying III-N material. For example, in IC 600 some MISFET structures (not depicted) may include gate dielectric materials 332 or 333 in direct contact with III-N material 305 and/or 310. Hence, an IC may include MISFET structures having a gate dielectric "type" that is any permutation of the different gate dielectric materials employed within the IC. For example, in IC 600 MISFETs may have any permutation of the three gate dielectric materials 331, 332, 333.

Figure 7:
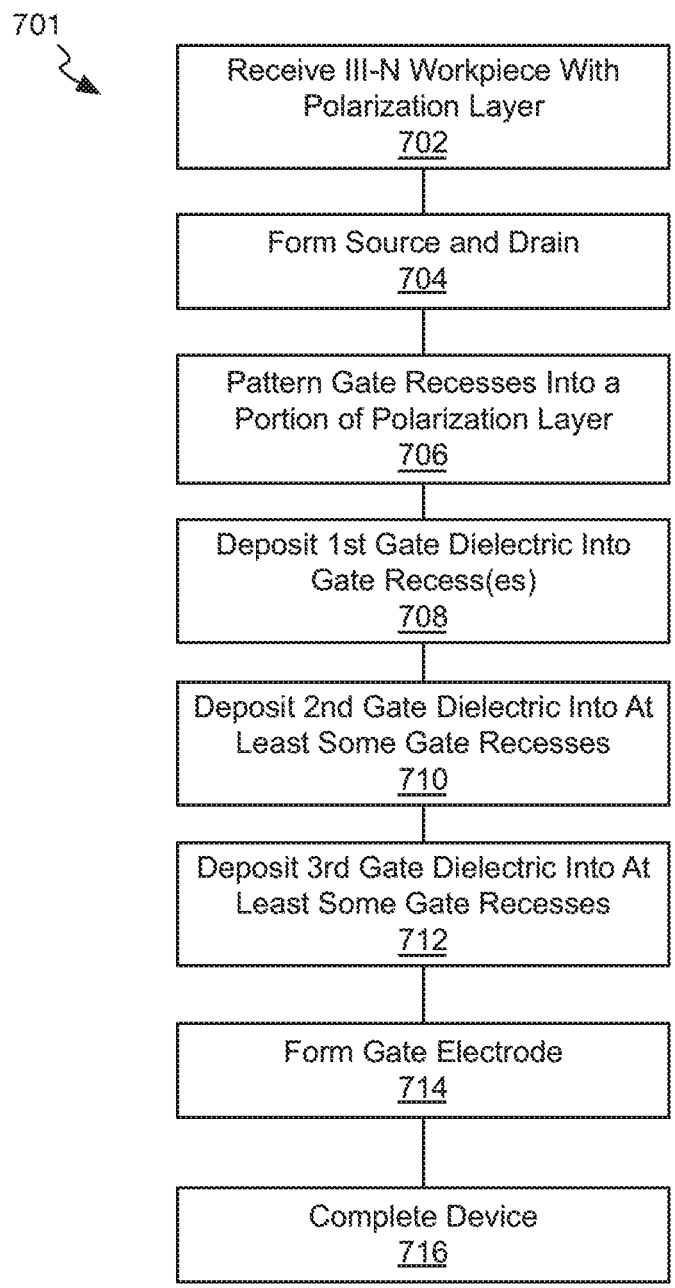
FIG. 7 is a flow diagram illustrating methods of forming III-N MISFET structures with different gate dielectrics, in accordance with some embodiments.

The transistor architectures described above may be fabricated according to a variety of techniques. FIG. 7 is a flow diagram illustrating methods 701 for forming an IC that includes III-N MISFETs with different gate dielectrics, in accordance with some embodiments.

Figure 8F:
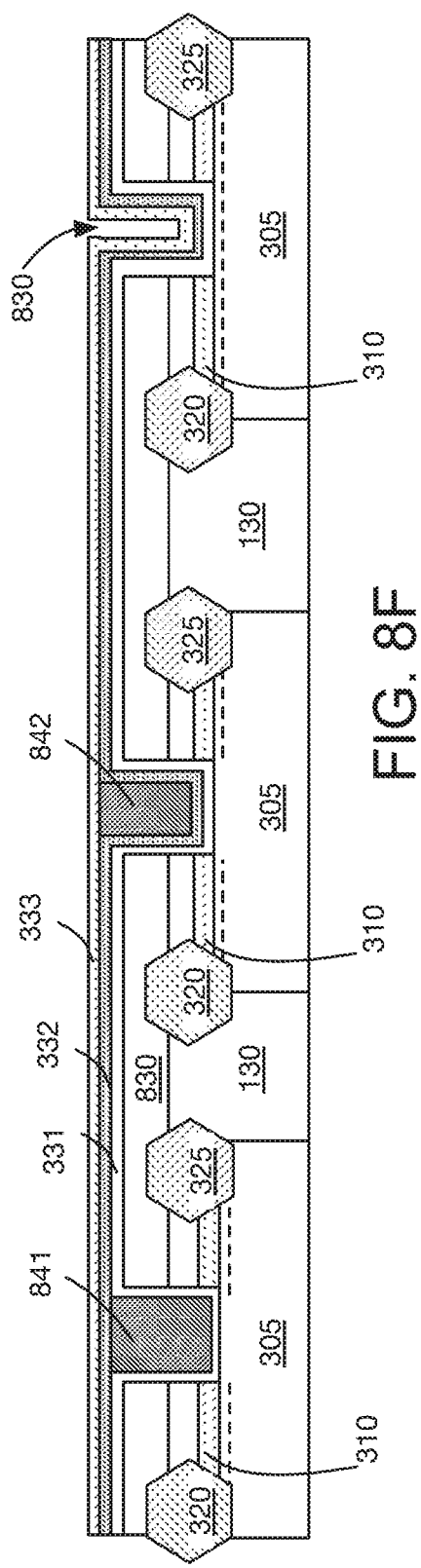

Methods 701 begin with receiving a workpiece at operation 702. Various epitaxial growth processes and/or fabrication processes may be employed upstream of methods 701 to prepare the workpiece received at operation 702. For some advantageous embodiments, the workpiece received at operation 702 comprises a substrate of crystalline group-IV materials (e.g., Si, Ge, SiGe). In some embodiments, the substrate received is a substantially monocrystalline (111) silicon substrate. Lattice mismatch between silicon and III-N crystals is most easily accommodated for the (111) plane. Nevertheless, other crystallographic orientations having greater lattice mismatch are also possible, such as, but not limited to, the (100), or (110) plane. A substrate may be bulk semiconductor or may be semiconductor on insulator (SOI). Substrate materials other than silicon are also possible, with examples including silicon carbide (SiC), sapphire, a III-V compound semiconductor (e.g., GaAs, InP). Substrates may have any level of impurity doping. Depending on the substrate, the workpiece received at operation 702 may include any number and/or thicknesses of III-N material layers. For example, the workpiece may include any III-N buffer architecture known to be suitable for the substrate, and may further include a III-N material layer known to be suitable as a transistor channel material, such as any of those described above. Over the channel material, the workpiece further includes any III-N material layer known to be suitable as a polarization material, such as any of those described above. FIG. 8A illustrates one exemplary workpiece that includes III-N material 310 over III-N material 305. III-N materials 310 and 305 have been patterned into features (e.g., mesas or islands) with dielectric material(s) 330 between and over the III-N material features.

Returning to FIG. 7, methods 701 continue at operation 704 where the transistor source and drain are formed according to any suitable techniques. In the example shown in FIG. 8B, a patterning process is employed to form openings through dielectric material 330 and expose portions of III-N material 310. Patterning of the source and drain openings may entail any masking and etching process known to be suitable for the polarization material, for example. Masking may comprise hardmasks and/or photodefinable mask materials. Etching may comprise wet chemical or dry (plasma) etch processes, for example. III-N material 305 may be similarly etched (e.g., with any wet chemical or dry etch process known to be suitable), for example to reveal a sidewall that intersects 2DEG 312. Source and drain semiconductor material, such as any of those described above, may then be deposited or epitaxial grown within the source and drain openings to arrive at the structure illustrated in FIG. 8B.

Returning to FIG. 7, methods 701 continue at operation 706 where a gate recess is patterned into a portion of the polarization material layer. As further shown in FIG. 8C, recesses 830 have been formed through a dielectric material 830, through dielectric material(s) 330, and through a partial thickness of III-N material 310. III-N material 310 may be removed, for example with an etch process similar to that employed at operation 704, albeit for a shorter process time targeted for example to achieve a desired threshold voltage. In the example shown, all recesses 830 have substantially the same recess depth, or z-height. For such embodiments, multiple separate gate recess "tuning" etches may be unnecessary. In some such embodiments, all recesses 830 have a depth suitable for rendering all devices operable in enhancement mode. Various ones of the gate stacks may then be differentiated through their gate dielectrics such that some FETs will ultimately be operable in depletion mode.

Returning to FIG. 7, methods 701 continue at operation 708 where a first gate dielectric material is deposited into at least one of the gate recesses that were opened at operation 706. Deposition of the first gate dielectric material may be selective such that a first gate dielectric material is deposited into fewer than all gate recesses formed at operation 706. For such embodiments, one or more of the recesses opened at operation 706 may be temporarily filled with a sacrificial material during the deposition of the gate dielectric material. Alternatively, and as for the example further illustrated in FIG. 8D, gate dielectric material 331 is deposited into all gate recesses 830 so that gate dielectric material 331 covers a bottom of the recess. Gate dielectric material 331 is deposited in a manner so that it is in contact with III-N material 310 and/or 305. Gate dielectric material 331 may also be deposited in a substantially conformal manner (e.g., by chemical vapor deposition or atomic layer deposition) so as to also cover a sidewall of the recess (e.g., contacting dielectric materials 330 and 830). Gate dielectric material 331 may further be deposited over a top surface of dielectric materials 330 and 830.

Returning to FIG. 7, methods 701 continue at operation 710 where a second gate dielectric material is deposited into at least one of the gate recesses that were opened at operation 706. Deposition of the second gate dielectric material may be non-selective such that a second gate dielectric material is deposited into all gate recesses formed at operation 706. Alternatively, the second gate dielectric material may be selectively deposited into fewer than all of the recesses opened at operation 706. In the selective deposition example shown in FIG. 8E a first of the gate recesses 830 is filled with a sacrificial gate material 841 prior to the deposition of the gate dielectric material 332. Sacrificial gate material 841 may be any material suitable for the purpose, such as, but not limited to a sacrificial light absorbing material (SLAM). Sacrificial gate material 841 is selectively formed within only a subset of gate recesses 830. Gate dielectric material 332 is then deposited into the remaining gate recesses 830 not filled with sacrificial gate material 841. Gate dielectric material 332 may be deposited for example directly over, or onto, gate dielectric material 331 to further line a bottom and a sidewall of the gate recess. Gate dielectric material 332 may also be deposited in a substantially conformal manner (e.g., by chemical vapor deposition or atomic layer deposition). Gate dielectric material 332 may be further deposited over gate dielectric material 331 that is over a top surface of dielectric materials 330 and 830.

Returning to FIG. 7, methods 701 continue at operation 712 where a third gate dielectric material is deposited into at least one of the gate recesses that were opened at operation 706. Deposition of the third gate dielectric material may be non-selective such that a third gate dielectric material is deposited into all gate recesses formed at operation 706. Alternatively, the second gate dielectric material may be selectively deposited into fewer than all of the recesses opened at operation 706. In the example shown in FIG. 8F another of the gate recesses 830 is filled with a sacrificial gate material 842 prior to the deposition of gate dielectric material 333. Sacrificial gate material 842 may be any material suitable for the purpose, such as, but not limited to, a SLAM. Sacrificial gate material 842 may be selectively formed within only a subset of gate recesses 830. Gate dielectric material 333 is deposited into all remaining unfilled gate recesses 830, for example directly over, or onto, gate dielectric material 332 further lining a bottom and a sidewall of the recess. Gate dielectric material 332 may also be deposited in a substantially conformal manner (e.g., by chemical vapor deposition or atomic layer deposition). Gate dielectric material 333 is further deposited over gate dielectric material 332 that is over a top surface of dielectric materials 330 and 830.

For embodiments where a MISFET is to include only a first and a third gate dielectric material, sacrificial gate material that had been deposited into a gate recess prior to deposition of a second gate dielectric material may be removed prior to depositing another (e.g., third) gate dielectric material at operation 712. For example, in further reference to FIG. 8F, sacrificial material 841 may be selectively removed prior to the deposition of gate dielectric material 332 to fabricate a gate dielectric that includes both gate dielectric material 331 and gate dielectric material 333, if desired.

Figure 8G:
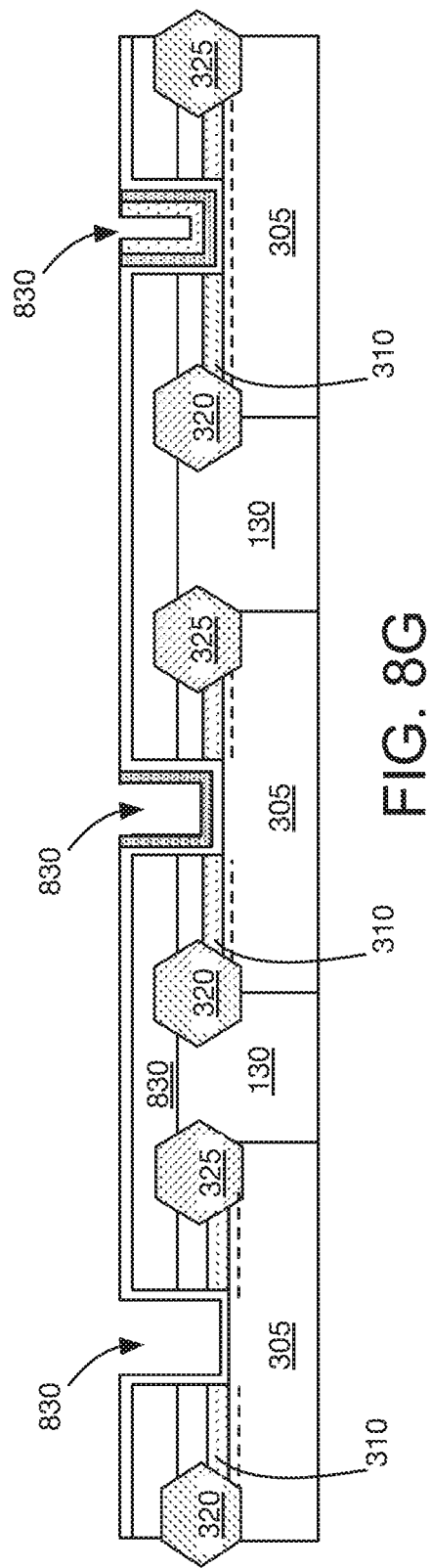

Returning to FIG. 7, methods 701 may continue with any number of additional gate dielectric material depositions performed in substantially the same manner as described for operations 708-712. Upon having deposited all gate dielectric materials, any remaining sacrificial gate materials may be removed. In the example shown in FIG. 8G, gate dielectric materials 333 and 332 that were deposited over one or more of sacrificial gate materials 841, 842 are removed, for example with any suitable etchback or polish. Prior to performing such an etchback, additional sacrificial gate material may be deposited to protect any exposed gate recesses 830. Following etchback of one or more of the gate dielectric materials, all sacrificial gate material may be removed from the gate recesses in preparation for a permanent (non-sacrificial) gate electrode material. In the example shown in FIG. 8G, sacrificial materials 841 and 842 have been removed to form recesses 830.

Figure 8H:
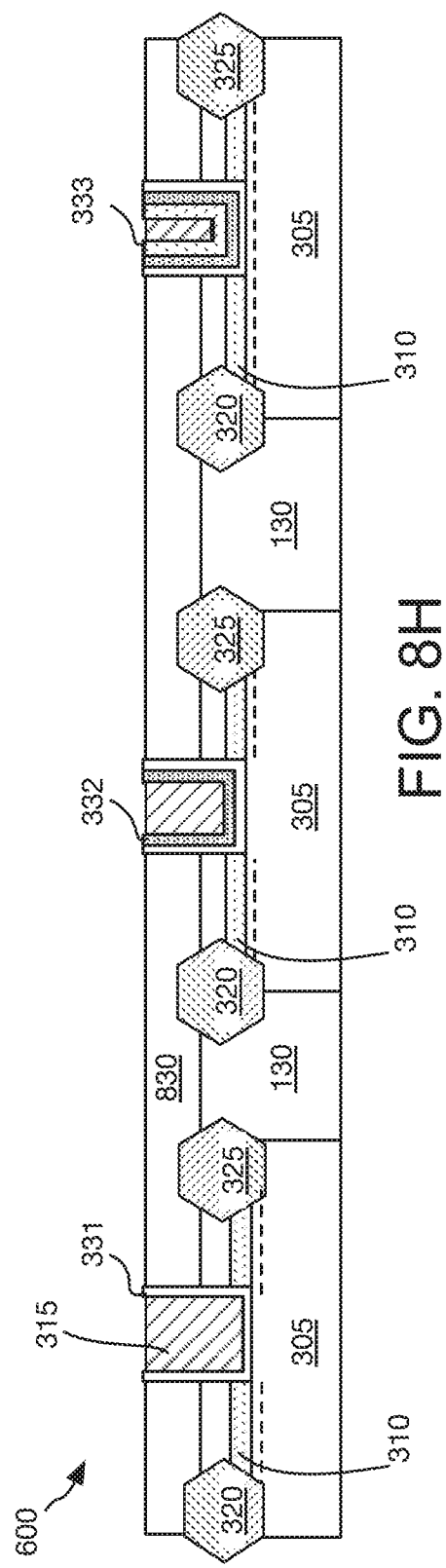

Returning to FIG. 7, methods 701 continue at operation 714 where gate electrodes are formed. Any techniques known to be suitable for forming a gate electrode may be employed as embodiments herein are not limited in this context. In exemplary embodiments, the same gate electrode material is deposited into gate recesses for all MISFETs of an IC. In other embodiments, more than one gate electrode (e.g., "workfunction") material is deposited selectively into various subsets of the MISFETs of an IC. In the example illustrated in FIG. 8H, gate electrode 315 is deposited over the different gate dielectrics fabricated for each illustrated MISFET. Gate electrode 315 is then planarized with a top surface of a gate dielectric material, and/or underlying dielectric material (e.g., dielectric material 830), to arrive at the structure of IC 600, substantially as introduced above in the context of FIG. 6.

Methods 701 (FIG. 7) then complete at operation 716 where any backend processes may be performed, for example to interconnect the plurality of MISFET structures into any suitable IC design, according to any known techniques. Notably, no particular order is required by methods 701. For example, the operations illustrated in FIG. 7 are numbered consecutively for the sake of discussion and the associated operations need not be so ordered.

Figure 9:
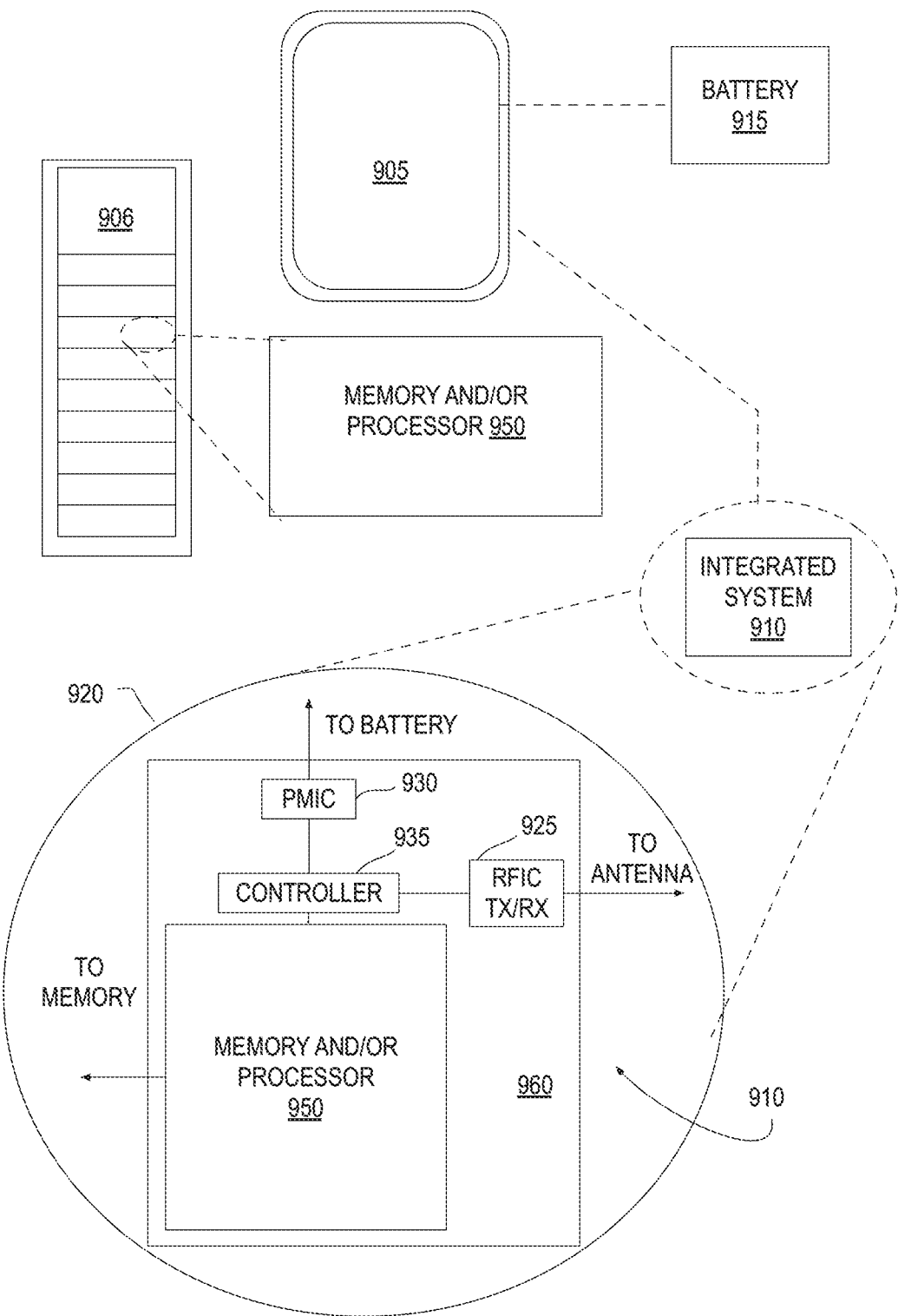
FIG. 9 illustrates a mobile computing platform and a data server machine employing an SoC including III-N MISFET structures with different gate dielectrics, in accordance with embodiments.

FIG. 9 illustrates a system in which a mobile computing platform 905 and/or a data server machine 906 employs an IC including III-N MISFETs having different gate dielectrics, for example as described elsewhere herein. The server machine 906 may be any commercial server, for example including any number of high-performance computing platforms disposed within a rack and networked together for electronic data processing, which in the exemplary embodiment includes a packaged IC 950. The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), a chip-level or package-level integrated system 910, and a battery 915.

Whether disposed within the integrated system 910 illustrated in the expanded view 920, or as a stand-alone packaged chip within the server machine 906, packaged IC 950 may include a memory chip (e.g., RAM), or a processor chip (e.g., a microprocessor, a multi-core microprocessor, graphics processor, or the like) including III-N MISFETs having different gate dielectrics, for example as described elsewhere herein. IC 950 may be further coupled to a board, a substrate, or an interposer 960 along with one or more of a power management integrated circuit (PMIC) 930, RF (wireless) integrated circuit (RFIC) 925 including a wideband RF (wireless) transmitter and/or receiver (TX/RX) (e.g., including a digital baseband and an analog front end module further comprises a power amplifier on a transmit path and a low noise amplifier on a receive path), and a controller 935. One or more of PMIC 930 and RFIC 925 may include III-N MISFETs having different gate dielectrics, for example as described elsewhere herein.

Functionally, PMIC 930 may perform battery power regulation, DC-to-DC conversion, etc., and so has an input coupled to battery 915 and with an output providing a current supply to other functional modules. As further illustrated, in the exemplary embodiment, RFIC 925 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the IC 950 or within a single IC coupled to the package substrate of the IC 950.

Figure 10:
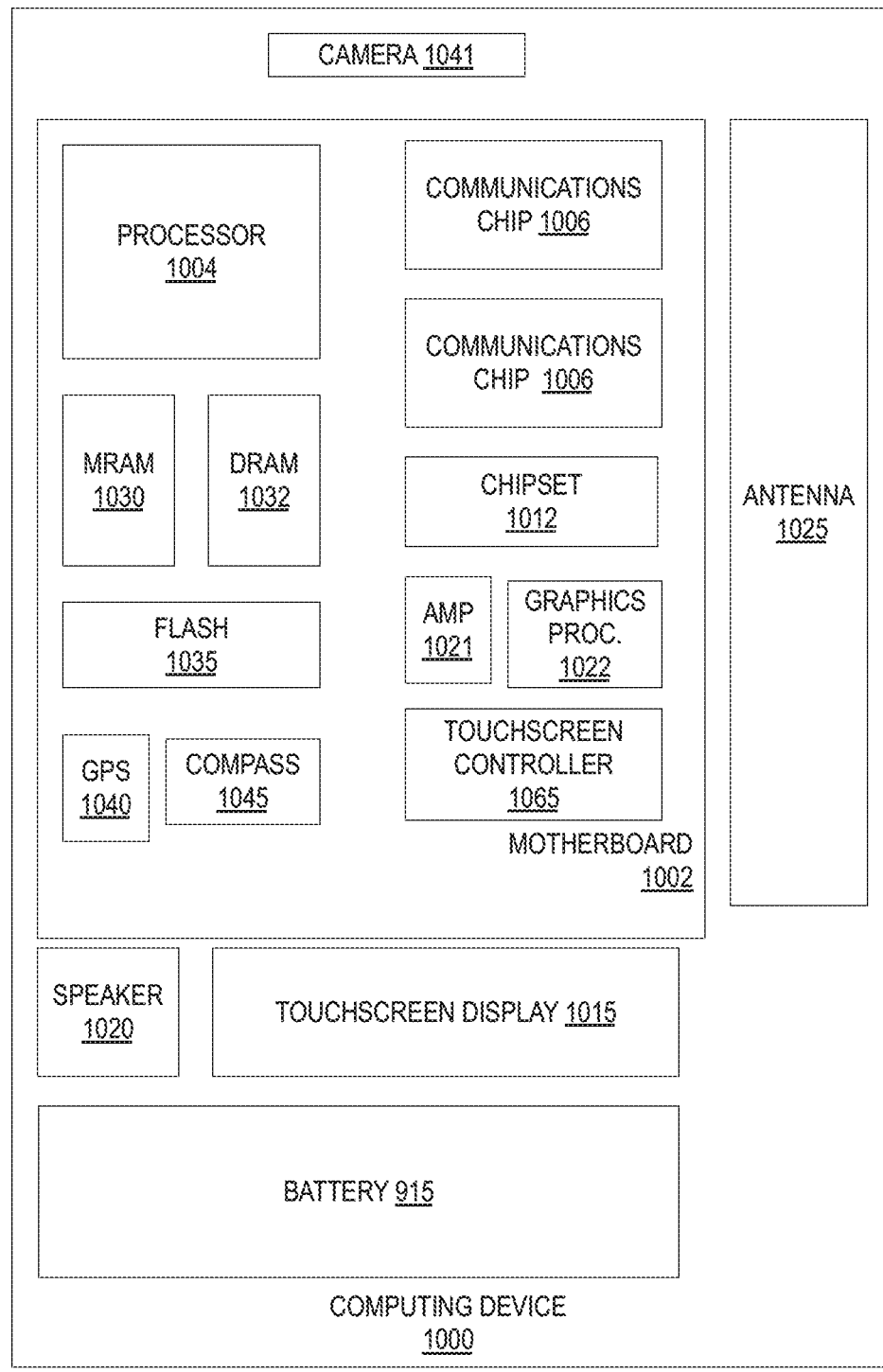
FIG. 10 is a functional block diagram of an electronic computing device, in accordance with some embodiments.

FIG. 10 is a functional block diagram of a computing device 1000, arranged in accordance with at least some implementations of the present disclosure. Computing device 1000 may be found inside platform 905 or server machine 906, for example. Device 1000 further includes a motherboard 1002 hosting a number of components, such as, but not limited to, a processor 1004 (e.g., an applications processor), which may further incorporate III-N MISFETs having different gate dielectrics, for example as described elsewhere herein. Processor 1004 may be physically and/or electrically coupled to motherboard 1002. In some examples, processor 1004 includes an integrated circuit die packaged within the processor 1004. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to the motherboard 1002. In further implementations, communication chips 1006 may be part of processor 1004. Depending on its applications, computing device 1000 may include other components that may or may not be physically and electrically coupled to motherboard 1002. These other components include, but are not limited to, volatile memory (e.g., DRAM 1032), non-volatile memory (e.g., MRAM 1030), flash memory 1035, a graphics processor 1022, a digital signal processor, a crypto processor, a chipset 1012, an antenna 1025, touchscreen display 1015, touchscreen controller, battery 915, audio codec, video codec, power amplifier, global positioning system (GPS) device 1040, compass 1045, accelerometer, gyroscope, speaker 1020, camera 1041, and mass storage device (such as hard disk drive, solid-state drive (SSD), compact disk (CD), digital versatile disk (DVD), and so forth), or the like.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1006 may implement any of a number of wireless standards or protocols, including but not limited to those described elsewhere herein. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others. One or more of communication chips 1006 may include III-N MISFETs having different gate dielectrics, for example as described elsewhere herein.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that embodiments other than those described in detail above may be practiced with modification and alteration without departing from the scope of the appended claims. For example the above embodiments may include specific combinations of features as further provided below.

In first examples, an integrated circuit (IC), comprises a first transistor, comprising a first source and a first drain coupled through a group III-nitride (III-N) material, a first gate electrode between the first source and the first drain, and a first gate dielectric material between the first gate electrode and the III-N material. The IC comprises a second transistor, comprising a second source and a second drain coupled through the III-N material, a second gate electrode between the second source and the second drain, and a second gate dielectric material between the second gate electrode and the III-N material, wherein the second gate dielectric material has a different composition than the first gate dielectric material.

In second examples, for any of the first examples the second transistor comprises the first dielectric material in addition to the second dielectric material.

In third examples, for any of the first through second examples the second dielectric material is between the first dielectric material and the gate electrode.

In fourth examples, for any of the first through the third examples the first gate electrode and the second gate electrode have substantially the same composition.

In fifth examples, for any of the first through the fourth examples the first transistor is an enhancement mode transistor, and the second transistor is a depletion mode transistor.

In sixth examples, for any of the first through the fifth examples the first transistor is an enhancement mode transistor and the second transistor is a depletion mode transistor, and/or the first transistor has a lower gate-drain breakdown voltage than the second transistor.

In seventh examples, for any of the first through the sixth examples the first dielectric material comprises a metal and oxygen, and the second dielectric material comprises at least one of silicon or nitrogen.

In eighth examples, for any of the seventh examples the metal is at least one of Hf and Al, and the second dielectric material comprises both silicon and nitrogen.

In ninth examples, for any of the first through the eighth examples the IC comprising a third transistor, the third transistor comprising a third source and a third drain coupled through the III-N material, a third gate electrode between the third source and the third drain, and a third gate dielectric material between the third gate electrode and the III-N material. The third gate dielectric material has a different composition than the first or second gate dielectric materials.

In tenth examples, for any of the ninth examples the third transistor further comprises at least one of the first and second gate dielectric materials in addition to the third dielectric material.

In eleventh examples, for any of the ninth through tenth examples the third transistor further comprises both of the first and second gate dielectric materials in addition to the third dielectric material, and wherein the second gate dielectric material is between the first and the third dielectric materials.

In twelfth examples, for any of the eleventh examples, the first transistor is an enhancement mode transistor, the second transistor is a depletion mode transistor, and the third transistor has a higher gate-drain breakdown voltage than the first and the second transistors.

In thirteenth examples, for any of the first through twelfth examples the III-N material is a first III-N material comprising Ga and N, and a second III-N material is between the first III-N material and individual ones of the first and second gate dielectrics, the second III-N material comprises more Al than the first III-N material, and a c-plane of the first and second III-N materials is no more than 10° from parallel to plane of an underlying substrate.

In fourteenth examples, an integrated circuit (IC), comprises a plurality of III-N metal-insulator-semiconductor field effect transistors (MISFETs), wherein separate ones of the MISFETs comprise different gate dielectric materials but comprise the same gate electrode material, and wherein separate ones of the MISFETs have at least one of: different gate-drain breakdown voltages or different threshold voltages.

In fifteenth examples, for any of the fourteenth examples a first of the MISFETs has a first dielectric material, and a second of the MISFETs has a second dielectric material between the gate electrode and the first dielectric material.

In sixteenth examples, for any of the thirteenth through fourteenth examples a third of the MISFETs has a third dielectric material in addition to, or instead of at least one of the first and second dielectric materials.

In seventeenth examples, a method of forming an integrated circuit (IC) comprises receiving a workpiece comprising a first III-N material under a second III-N material. The method comprises forming a first source and first drain within a first region of the workpiece. The method comprises forming a second source and second drain within a second region of the workpiece. The method comprises forming a dielectric material over the first region and over the second region. The method comprises forming recesses within the dielectric material. A first of the recesses exposes a III-N material between the first source and the first drain, and a second of the recesses exposes a III-N material between the second source and the second drain. The method comprises depositing a first gate dielectric material within the first recess, and depositing a second gate dielectric material within the second recess. The method comprises forming a gate electrode over the first gate dielectric material and over the second gate dielectric material.

In eighteenth examples, for any of the seventeenth examples forming the recess further comprises forming a mask with an opening over a portion of the second III-N material, and etching partially through the second III-N material.

In nineteenth examples, for any of the seventeenth through eighteenth examples depositing the second gate dielectric material further comprises depositing the second gate dielectric material over the first gate dielectric material.

In twentieth examples, for any of the seventeenth through nineteenth examples depositing the second gate dielectric material further comprises filling the first recess with a sacrificial material that prevents the second dielectric material from depositing within the first recess, and wherein forming the gate electrode over the first gate dielectric further comprises removing the sacrificial material from the first recess prior to depositing a gate electrode material into both the first and second recesses.

In twenty-first examples, for any of the seventeenth through twentieth examples depositing the first gate dielectric material further comprises filling the second recess with a sacrificial material that prevents the first dielectric material from depositing within the first recess. Depositing the second gate dielectric material further comprises removing the sacrificial material from the second recess and depositing the second dielectric onto the III-N material exposed within the second recess.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC), comprising:
   a first transistor, comprising:
      a first source and a first drain coupled through a first group III-nitride (III-N) material;
      a first gate electrode between the first source and the first drain; and
      a first gate dielectric material between the first gate electrode and the first III-N material,
         wherein the first gate dielectric material is in contact with the first gate electrode and comprises a metal and oxygen, wherein the first gate dielectric material is in contact with a second III-N material that is in contact with the first III-N material, and wherein the second III-N material comprises more Al than the first III-N material; and
   a second transistor, comprising:
      a second source and a second drain coupled through the first III-N material;
      a second gate electrode between the second source and the second drain; and
      the first gate dielectric material and a second gate dielectric material between the second gate electrode and the second III-N material, wherein the second gate dielectric material is in contact with the second gate electrode and comprises silicon, and wherein the first gate dielectric material is in contact with the second III-N material and the second III-N material is in contact with the first III-N material.

2. The IC of claim 1, wherein the second gate dielectric material comprises oxygen.

3. The IC of claim 2, wherein the gate second dielectric material is in contact with the first gate dielectric material.

4. The IC of claim 3, wherein the first gate electrode and the second gate electrode have substantially the same composition.

5. The IC of claim 4, wherein the first transistor is an enhancement mode transistor and the second transistor is a depletion mode transistor.

6. The IC of claim 1, wherein
the first transistor has a lower gate-drain breakdown voltage than the second transistor.

7. The IC of claim 1, wherein the second gate dielectric material comprises nitrogen.

8. The IC of claim 1, wherein the metal is at least one of Hf or Al.

9. The IC of claim 1, further comprising a third transistor, the third transistor comprising:
   a third source and a third drain coupled through the first III-N material;
   a third gate electrode between the third source and the third drain; and
   a third gate dielectric material between the third gate electrode and the second III-N material,
      wherein the third gate dielectric material is in contact with the third gate electrode and has a different composition than the first or second gate dielectric materials.

10. The IC of claim 9, wherein the third transistor further comprises at least one of the first and second gate dielectric materials in addition to the third gate dielectric material.

11. The IC of claim 10, wherein the third transistor further comprises both of the first and second gate dielectric materials in addition to the third gate dielectric material, and wherein the third gate dielectric material has more nitrogen than the second gate dielectric material.

12. The IC of claim 11, wherein:
the first transistor is an enhancement mode transistor;
the second transistor and the third transistor are depletion mode transistors; and
the third transistor has a higher gate-drain breakdown voltage than the first transistor.

13. The IC of claim 1, wherein:
the first III-N material comprises Ga and N; and
the second III-N material is absent from between the first III-N material and the first gate dielectric material for both the first and second transistors.

* * * * *